United States Patent
Lee et al.

(10) Patent No.: US 12,439,529 B2
(45) Date of Patent: Oct. 7, 2025

(54) PLURALITY OF BUILD-UP LAYERS IN A CIRCUIT BOARD STRUCTURE

(71) Applicant: UNIMICRON TECHNOLOGY CORP., Taoyuan (TW)

(72) Inventors: Shao-Chien Lee, Taoyuan (TW); Ching-Sheng Chen, Taoyuan (TW); Heng-Ming Nien, Taoyuan (TW); Pei-Wei Wang, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 550 days.

(21) Appl. No.: 17/899,467

(22) Filed: Aug. 30, 2022

(65) Prior Publication Data

US 2024/0023251 A1    Jan. 18, 2024

(30) Foreign Application Priority Data

Jul. 15, 2022    (TW) .................................. 111126634

(51) Int. Cl.
| | |
|---|---|
| H05K 3/46 | (2006.01) |
| H01L 21/48 | (2006.01) |
| H01L 23/498 | (2006.01) |
| H05K 1/02 | (2006.01) |
| H05K 1/11 | (2006.01) |
| H05K 3/40 | (2006.01) |

(52) U.S. Cl.
CPC ....... *H05K 3/4679* (2013.01); *H01L 21/4857* (2013.01); *H01L 23/49822* (2013.01); *H05K 1/0298* (2013.01); *H05K 1/113* (2013.01); *H05K 1/116* (2013.01); *H05K 3/4046* (2013.01); *H05K 3/4602* (2013.01); *H05K 2203/016* (2013.01); *H05K 2203/1131* (2013.01)

(58) Field of Classification Search
CPC ........... H01L 21/4857; H01L 23/49822; H01L 3/4602; H05K 3/4679; H05K 1/0298; H05K 1/116; H05K 3/4046; H05K 1/113
See application file for complete search history.

(56) References Cited

U.S. PATENT DOCUMENTS

| | | | |
|---|---|---|---|
| 9,875,957 B2 | 1/2018 | Shimizu et al. | |
| 10,888,001 B2 * | 1/2021 | Lin ........................ | H05K 1/111 |
| 2008/0128911 A1 | 6/2008 | Koyama | |
| 2019/0380212 A1 * | 12/2019 | Chien .................. | H05K 3/4623 |
| 2021/0076508 A1 * | 3/2021 | Lin ...................... | H05K 3/0097 |
| 2023/0178520 A1 * | 6/2023 | Lin ...................... | H10H 20/018 |
| | | | 257/91 |

* cited by examiner

*Primary Examiner* — Alonzo Chambliss
(74) *Attorney, Agent, or Firm* — Maschoff Brennan

(57) ABSTRACT

A manufacturing method for circuit board structure includes steps of providing a carrier, forming a first build-up layer including a plurality of first circuits, forming a second build-up layer including a plurality of second circuits on a side of the first build-up layer located away from the carrier, attaching a side of the second build-up layer located away from the first build-up layer to a core layer, and removing the carrier from the first build-up layer, where the first circuits are finer than the second circuits.

11 Claims, 14 Drawing Sheets

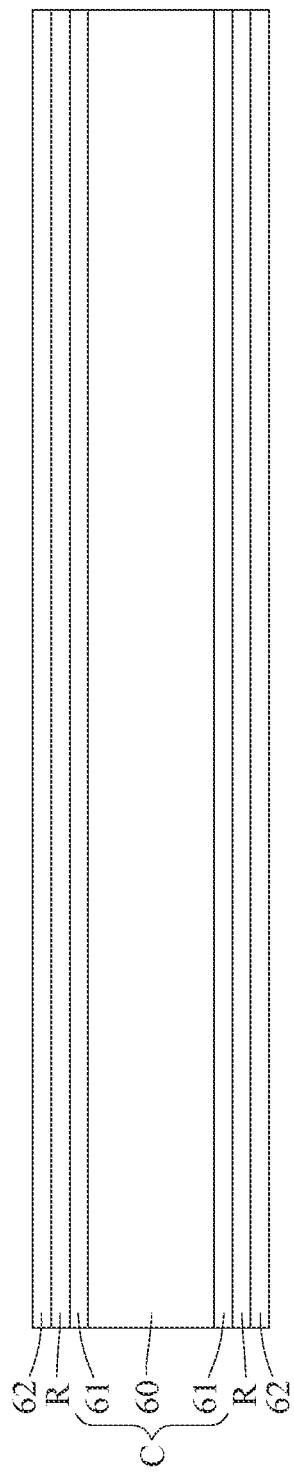
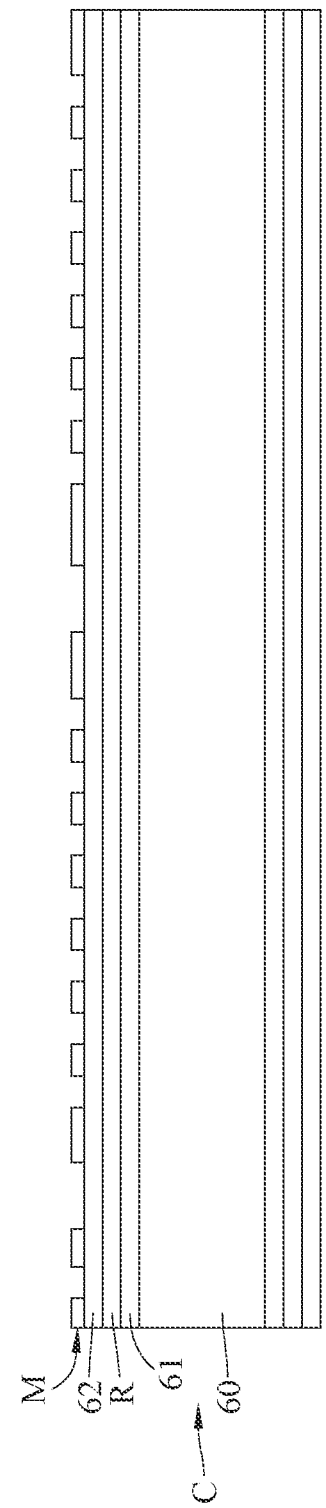

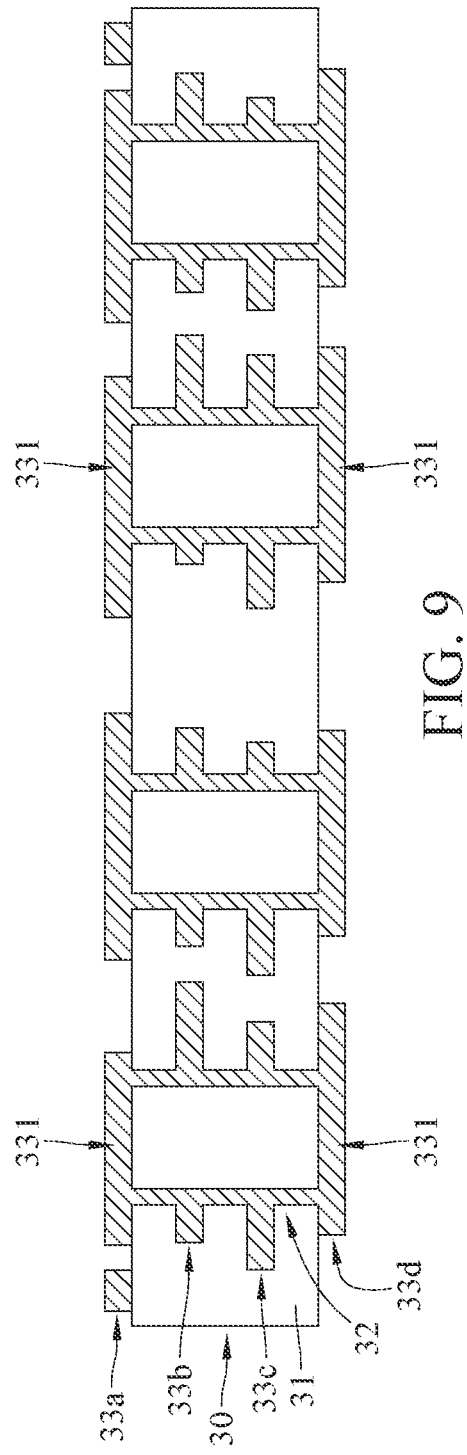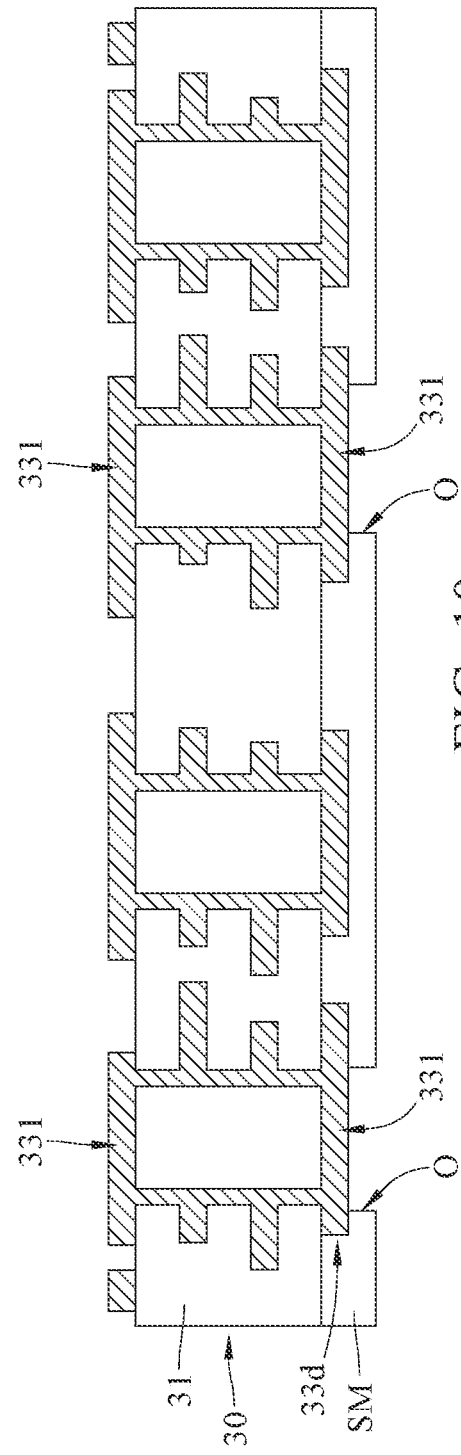

PLURALITY OF BUILD-UP LAYERS IN A CIRCUIT BOARD STRUCTURE

CROSS-REFERENCE TO RELATED APPLICATIONS

This non-provisional application claims priority under 35 U.S.C. § 119(a) on Patent Application No(s). 111126634 filed in Taiwan (R.O.C.) on Jul. 15, 2022, the entire contents of which are hereby incorporated by reference.

TECHNICAL FIELD

The disclosure relates to a manufacturing method for circuit board structure, more particularly relates to a circuit board structure and a manufacturing method thereof.

BACKGROUND

Many semiconductor packages employ multilayer wiring structure manufactured by build-up or lamination technique. Generally, a multilayer wiring structure has an alternate stack of copper foils and dielectric layers with required patterns of wirings and conductive vias implemented among different layers of conductive materials.

To enable higher interconnection density and signal routing, packages require one or more redistribution layers and fine line width/spacing in the minimum form factor. Conventionally, due to the fragile nature of the fine lines inherent in the redistribution layer, the redistribution layer is formed after the formation of other build-up layers whose line pitch is not as fine as that of the redistribution layer. In specific, the other build-up layers are firstly formed on a core layer, and then the redistribution layer is formed onto the other build-up layers. However, the number of the build-up layers increases, the lower flatness the build-up layers offers for the formation of the redistribution layer, and the flatness degradation formed under the influence of the lower build-up layers will cause focus errors during exposure operation and thereby affecting the yield rate.

There is another process that attaches a redistribution layer formed on another substrate onto the regular build-up layers formed on a core layer using tin balls as adhesive means therebetween. However, the limitations of the size and alignment requirement of the tin balls are unable to support the fine line width/spacing required by a redistribution layer, and the conductivity of the tin balls are lower than copper so that noise will occur during high-frequency transmission and thereby reducing the integrity of high-frequency signals.

SUMMARY

Accordingly, one aspect of the disclosure is to provide a circuit board structure and a manufacturing method thereof which are capable of solving the aforementioned problems due to conventional method for manufacturing redistribution layer.

One embodiment of the disclosure provides a manufacturing method for circuit board structure including steps of providing a carrier, forming a first build-up layer including a plurality of first circuits, forming a second build-up layer including a plurality of second circuits on a side of the first build-up layer located away from the carrier, attaching a side of the second build-up layer located away from the first build-up layer to a core layer, and removing the carrier from the first build-up layer, where the first circuits are finer than the second circuits.

In one embodiment of the disclosure, the step of forming the first build-up layer on the carrier includes: alternately stacking a plurality of first dielectric layers and a plurality of first circuit layers formed by the plurality of first circuits on the carrier; and forming at least one first conductive via which penetrates through the plurality of first dielectric layers and is interposed between the plurality of first circuit layers.

In one embodiment of the disclosure, the step of forming the second build-up layer on the side of the first build-up layer located away from the carrier includes: alternately stacking a plurality of second dielectric layers and a plurality of second circuit layers formed by the plurality of second circuits on the side of the first build-up layer located away from the carrier, wherein the at least one first conductive via is structurally connected to one of the plurality of second circuit layers; and forming at least one second conductive via which penetrates through the plurality of second dielectric layers and is interposed between the plurality of second circuit layers.

In one embodiment of the disclosure, the step of attaching the side of the second build-up layer located away from the first build-up layer to the core layer includes: forming a bonding layer on the core layer; and attaching the second build-up layer to the bonding layer.

In one embodiment of the disclosure, the step of forming the bonding layer on the core layer includes: forming a dielectric build-up layer on the core layer; forming at least one hole which penetrates through the dielectric build-up layer and exposes at least one conductive contact of the core layer; and applying at least one conductive paste into the at least one hole, wherein the at least one conductive paste sticks out of the at least one hole and is structurally connected to one of the plurality of second circuit layers of the second build-up layer.

In one embodiment of the disclosure, the step of attaching the second build-up layer to the bonding layer includes: sintering the at least one conductive paste to secure the second build-up layer to the core layer.

In one embodiment of the disclosure, the manufacturing method, after the step of forming the dielectric build-up layer on the core layer, further includes: disposing a protective layer on a side of the dielectric build-up layer located away from the core layer; forming the at least one hole which penetrates through the dielectric build-up layer and the protective layer; and applying the at least one conductive paste into the at least one hole to make the at least one conductive paste stick out of a surface of the protective layer located away from the dielectric build-up layer.

In one embodiment of the disclosure, the manufacturing method further includes: forming at least one alignment target hole on a side of the carrier located away from the first build-up layer for the second build-up layer to align with the core layer.

In one embodiment of the disclosure, the manufacturing method further includes: disposing a release film on the carrier; and removing the carrier and the release film on the carrier from the first build-up layer.

Another embodiment of the disclosure provides a circuit board structure including a first build-up layer comprising a plurality of first circuits and at least one first conductive via structurally connected to at least part of the plurality of first circuits, a second build-up layer disposed on the first build-up layer and comprising a plurality of second circuits and at least one second conductive via structurally connected to at least part of the plurality of second circuits, and a core layer disposed on a side of the second build-up layer located away from the first build-up layer. The first circuits are finer than the second circuits, and the first conductive via and the second conductive via are tapered towards a direction away from the core layer.

In one embodiment of the disclosure, the circuit board structure further includes a dielectric build-up layer and at least one conductive paste, wherein the dielectric build-up layer is located between the core layer and the second build-up layer, the at least one conductive paste penetrates through the dielectric build-up layer and is structurally connected between part of the plurality of second circuits and at least one conductive contact of the core layer.

According to the circuit board structure and the manufacturing method as discussed in the above embodiments of the disclosure, since the first build-up layer which includes the first circuits being finer than the second circuits of the second build-up layer is formed on the carrier and then the second build-up layer is formed on the first build-up layer, the first build-up layer is formed on a relatively high flatness environment and therefore is favorable for preventing focus errors during exposure operation and thereby is suitable to be employed as a redistribution layer with required accuracy, density, yield rate, and uniformity of fine pitch.

Also, since the second build-up layer is formed on the first build-up layer, the first and second build-up layers can be formed under the same build-up technique, which not only can simplify the manufacturing processes and reduce the cost but also can prevent the problems of low conductivity, increase of high frequency noise, and low integrity of high frequency signal due to the usage of tin balls.

In addition, the first build-up layer is firstly formed on the carrier and then the second build-up layer is formed on the first build-up layer, thus, before the removal of the carrier, the first build-up layer is arranged between the second build-up layer and the carrier and therefore is prevented from exposing to ambient air or being damaged due to unexpected impact or hitting.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIGS. 1-22 depict the steps of a method according to one embodiment of the disclosure for manufacturing a circuit board structure.

DETAILED DESCRIPTION

Figure 3:
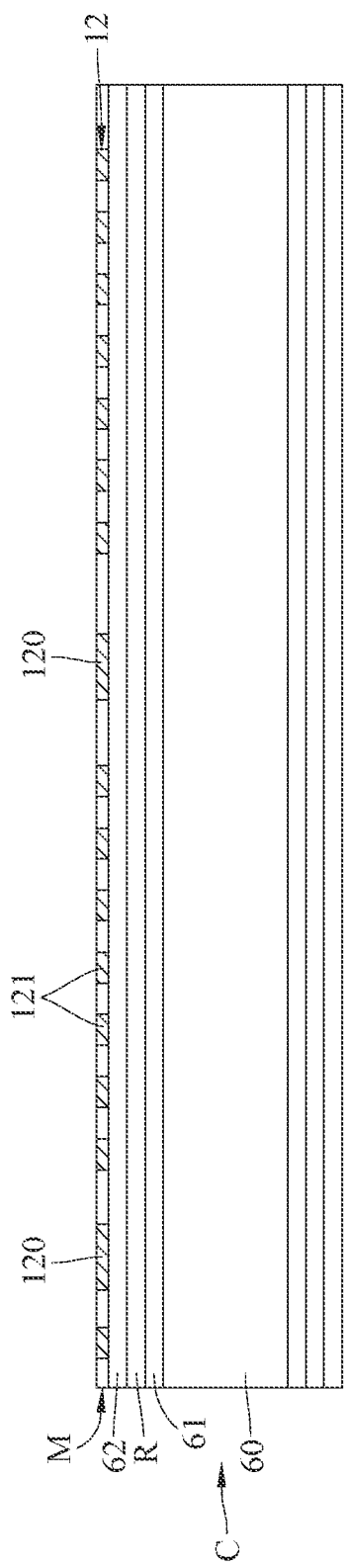

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. Unless specified or limited otherwise, the terms "mounted", "connected", "disposed", "fixed", and variations thereof are used broadly and encompass both direct and indirect mounting, connection, disposing, and fixing.

The steps involved in a method according to one embodiment of the disclosure for manufacturing a circuit board structure are provided with reference to FIGS. 1-22. It is noted that FIGS. 1-22 are depicted in cross-sectional views.

Firstly, as shown in FIG. 1, a carrier C is provided. The configuration, type and material of the carrier C are determined according to actual requirements and are not intended to limit the disclosure. For example, in this embodiment, the carrier C may include a substrate 60 which is, for example, a glass substrate, a silicon substrate, a ceramic substrate, or a combination thereof. Optionally, the carrier C may further include two metallic films 61 disposed at two opposite sides (or, two opposite surfaces) of the substrate 60. The metallic films 61 may each be a metallic layer having a suitable thickness. For example, in some embodiments, the metallic film 61 may be a copper foil having a thickness of about 18 µm. It is noted that the formation, material, and thickness of the metallic film 61 may be determined according to actual requirements and are not intended to limit the disclosure.

In addition, in this embodiment, two opposite sides (or, two opposite surfaces) of the carrier C may each have a release film R thereon; in other words, the surfaces of the metallic films 61 located away from the substrate 60 may each have a release film R thereon. The release film R is, but not limited to, a photo-curable release film, a thermal curable release film, or a laser debond release film with a thickness of about 100 nm. It is noted that the formation, material, and thickness of the release film R may be determined according to actual requirements and are not intended to limit the disclosure.

Optionally, in this embodiment, the surface of the release film R located away from the carrier C has a metallic film 62 thereon. The metallic film 62 may be a metallic layer having a suitable thickness. For example, in some embodiments, in some embodiments, the metallic film 62 may be a copper foil having a thickness of about 3 µm. It is noted that the formation, material, and thickness of the metallic film 62 may be determined according to actual requirements and are not intended to limit the disclosure.

Figure 8:
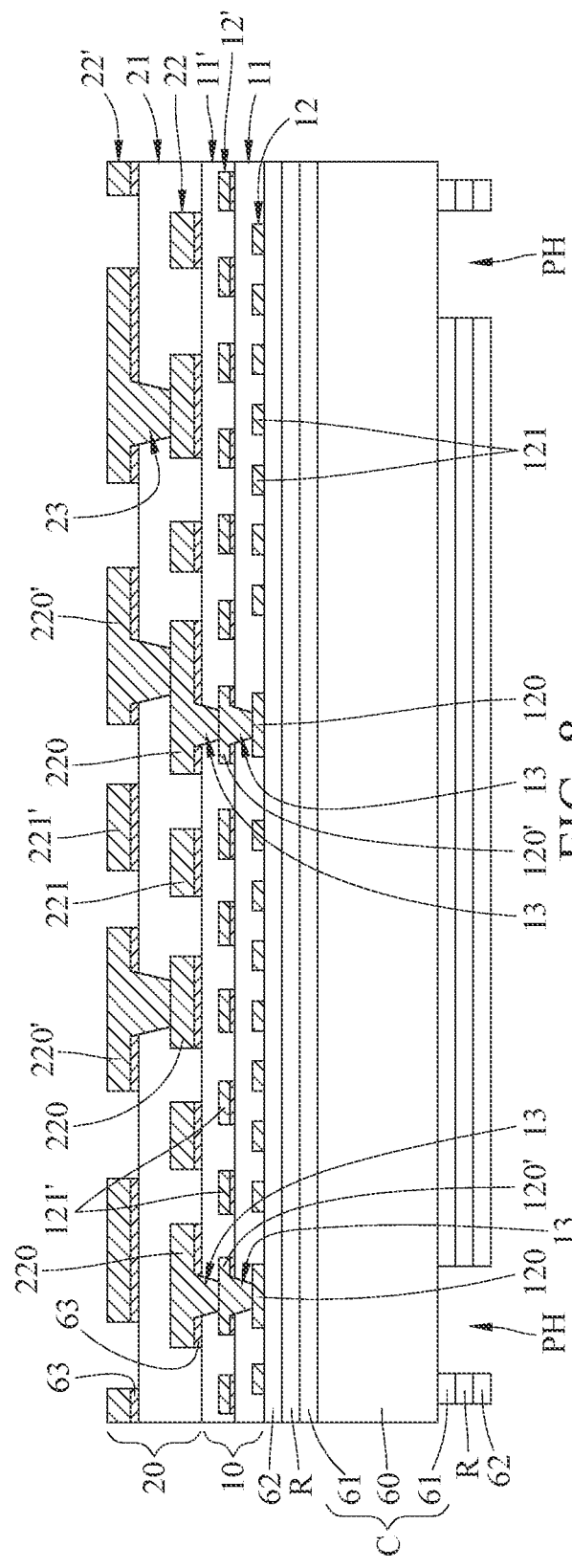

Then, a first build-up layer 10 is to be formed on one of the metallic films 62 on the carrier C (as shown in FIG. 8). To do so, please refer to FIG. 2, a patterned mask M is selectively formed on one of the metallic films 62 on the carrier C. Specifically, a patterned mask M is selectively formed on a surface (or a side) of one of the metallic films 62 located away from the release film R. The formation of the patterned mask M may involve the following steps: forming a photosensitive dielectric material on the selected surface using, for example, chemical vapor deposition (CVD) or physical vapor deposition (PVD), removing part of the photosensitive dielectric material that is exposed to radiation so as to obtain a patterned mask M. The patterned mask M may be a mask with a specific patterned configuration able to expose predetermined areas of the metallic film 62 that will be used to define the pattern and position of the first circuit layer 12 (as shown in FIG. 3) formed in the later steps. It is noted that the pattern of the patterned mask M may be determined according to actual requirements and is not intended to limit the disclosure.

Then, please refer to FIG. 3, a first circuit layer 12 made of suitable metallic material (e.g., copper) is formed on the area of the metallic film 62 not covered by the patterned mask M using process, such as electroplating or chemical plating. The first circuit layer 12 may include a plurality of first pads 120 and a plurality of first circuits 121. It is noted that the quantity and arrangement of the first pads 120 and the first circuits 121 of the first circuit layer 12 may be determined according to actual requirements and are not intended to limit the disclosure.

Figure 4:
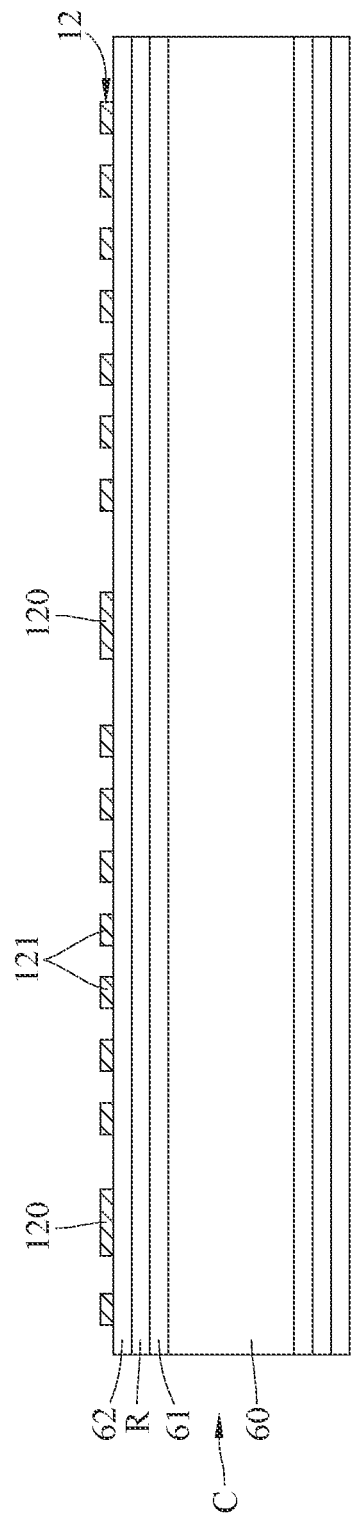

Then, please refer to FIG. 4, the patterned mask M is removed to reveal the part of the metallic film 62 that was covered by the patterned mask M. As shown, the first pads 120 and the first circuits 121 of the first circuit layer 12 remain on the metallic film 62. It is also noted that the thicknesses of the patterned mask M and the first circuit layer 12 may be determined according to actual requirements and are not intended to limit the disclosure.

Figure 5:
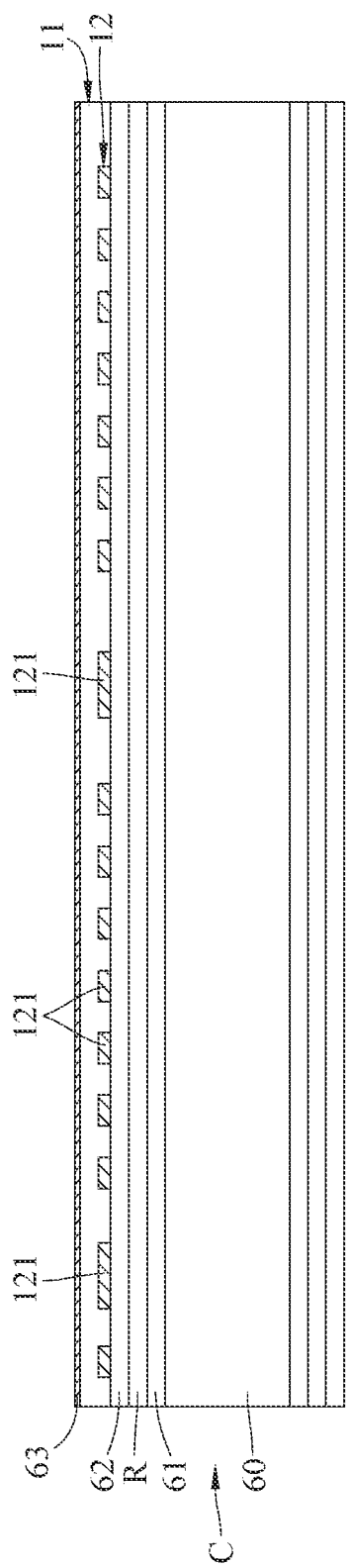

Then, please refer to FIG. 5, a first dielectric layer 11 is formed to cover the first circuit layer 12 and the metallic film 62. The first dielectric layer 11 is a layer of dielectric material formed to have a suitable thickness. For example, the first dielectric layer 11 is, for example, a prepreg, a photoimageable dielectric, PID, a photosensitive polymer (e.g., Benzocyclobutene), an ABF (Ajinomoto build-up film), a fiberglass resin, or a combination thereof.

Optionally, a metallic film 63 may be formed on a surface of the first dielectric layer 11 located away from the first circuit layer 12. The metallic film 63 is, but is not limited to, a copper foil with a suitable thickness. In some embodiments, the metallic film 63 and the first dielectric layer 11 may together form a resin coated copper foil. The existence of the metallic film 63 is beneficial to stack another first circuit layer 12' (as shown in FIG. 7) on the first dielectric layer 11.

Figure 6:
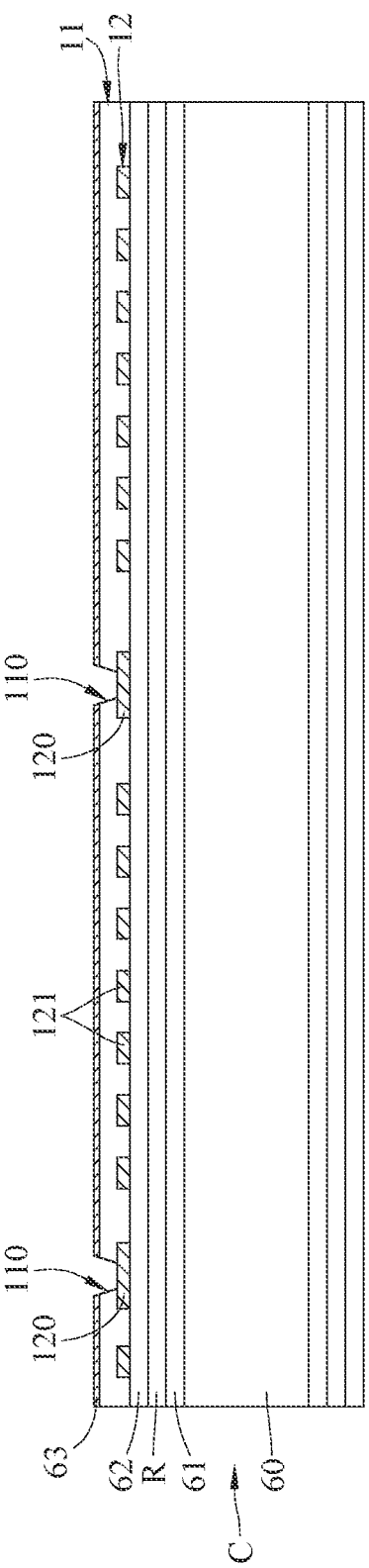

Then, please refer to FIG. 6, one or more through holes 110 are selectively formed on the first dielectric layer 11. For example, the through holes 110 penetrate through the metallic film 63 and the first dielectric layer 11 to expose the first pads 120 of the first circuit layer 12. The through hole 110 is formed by, but not limited to, means of laser beam machining or any suitable etching process. Thus, as shown, the through hole 110 is formed to have a tapered profile. Specifically, an inner diameter or aperture of the through hole 110 gradually decreases in a direction towards the carrier C; in other words, the inner diameter or aperture of the through hole 110 gradually increases in a direction away from the carrier C. In short, the through hole 110 is tapered towards the carrier C. It is noted that the formation and quantity of the through hole 110 may be determined according to actual requirements and are not intended to limit the disclosure.

Figure 7:
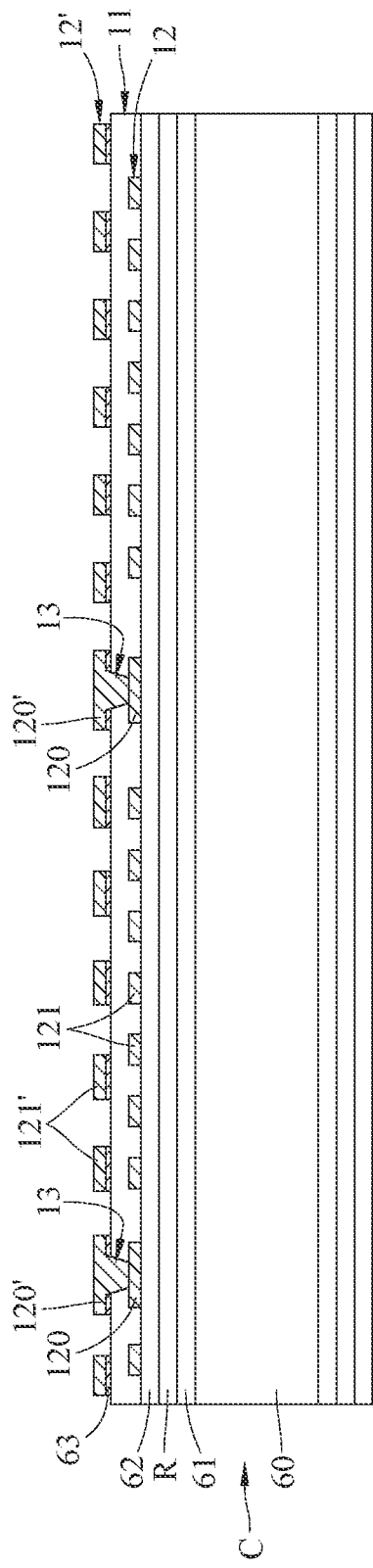

Then, optionally, please refer to FIG. 7, the processes mentioned with reference to FIGS. 2-4 are performed on the metallic film 63 to thus forming a first circuit layer 12' on the metallic film 63 and thereby forming a plurality of first conductive vias 13 at the through holes 110, where the first conductive vias 13 penetrate through the first dielectric layer 11 and structurally connect the first pads 120 of the first circuit layer 12. The first circuit layer 12' and the first circuit layer 12 may have the same or similar pattern, thickness, line width and/or line spacing. As shown, the first circuit layer 12' may include a plurality of first pads 120' and a plurality of first circuits 121'. It is noted that the quantity and arrangement of the first pads 120' and the first circuits 121' of the first circuit layer 12' may be determined according to actual requirements and are not intended to limit the disclosure. The first conductive vias 13 are interposed between the first circuit layer 12 and the first circuit layer 12'; in specific, first conductive vias 13 are structurally connected between the first pads 120 of the first circuit layer 12 and the first pads 120' of the first circuit layer 12'. Since the first conductive vias 13 are formed at the through holes 110, the first conductive vias 13 also have a tapered profile. Thus, an outer diameter of the first conductive via 13 gradually decreases in a direction towards the carrier C; in other words, the outer diameter of the first conductive via 13 gradually increases in a direction away from the carrier C. In short, the first conductive via 13 is tapered towards the carrier C.

As shown in FIG. 7, the first circuit layer 12 is located at the side (or, surface) of the first dielectric layer 11 located close to the carrier C, and the first circuit layer 12' is located at the side (or, surface) of the first dielectric layer 11 located away from the carrier C; in other words, the first circuit layer 12, the first dielectric layer 11, and the first circuit layer 12' are alternately stacked on the carrier C. The first conductive vias 13 are formed within the first dielectric layer 11 to structurally connect the first pads 120 of the first circuit layer 12 and the first pads 120' of the first circuit layer 12' so that the first circuit layer 12 and the first circuit layer 12' are electrically connected to each other via these first conductive vias 13.

Then, please refer to FIG. 8, the processes mentioned with reference to FIG. 5 are performed on the first dielectric layer 11 to thus forming a first dielectric layer 11' on the first dielectric layer 11. The first dielectric layer 11' may have the same or similar material or configuration to that of the first dielectric layer 11. In detail, the first dielectric layer 11' is a layer of dielectric material with a suitable thickness, the first dielectric layer 11' is formed to cover the first circuit layer 11 and the first pads 120' and the first circuits 121' of the first circuit layer 12'. As such, the first circuit layer 12, the first dielectric layer 11, the first circuit layer 12', and the first dielectric layer 11' are alternately stacked on the carrier C and thereby forming a first build-up layer 10 on the release film R located at one side (or, surface) of the carrier C. In this embodiment, the first build-up layer is formed by alternately stacking conductive and non-conductive layers on the carrier, each first circuit layer and first dielectric layer may be considered as a sub-layer of the first build-up layer, but it is noted that the number of the sub-layers of a first build-up layer may be determined according to actual requirements and are not intended to limit the disclosure. In some other embodiments, one first build-up layer may only include one first dielectric layer and one first circuit layer which are arranged in alternate manner. In another embodiment, one first build-up layer may include more required number of first dielectric layers and first circuit layers which are arranged in alternate manner.

Then, as shown in FIG. 8, a second build-up layer 20 is formed or stacked on a side (or, surface) of the first build-up layer 10 located away from the carrier C using processes similar to the formation of the first build-up layer 10 as discussed above. In specific, the processes mentioned with reference to FIGS. 5-7 are performed on the side (or, surface) of the first build-up layer 10 located away from the carrier C to thus firstly forming a plurality of through holes which expose the first pad 120' of the first circuit layer 12' and then forming a second circuit layer 22 on the side (or, surface) of the first dielectric layer 11' located away from the carrier C and forming a plurality of first conductive vias 13 within the through hole at the first dielectric layer 11', where the second circuit layer 22 includes a plurality of second pads 220 and a plurality of second circuits 221. It is noted that the quantity and arrangement of the second pads 220 and the second circuits 221 of the second circuit layer 22 may be determined according to actual requirements and are not intended to limit the disclosure. The first conductive vias 13 in the first dielectric layer 11' are structurally connected to the first pads 120 of the first circuit layer 12' and the second pad 220 of the second circuit layer 22 so that the first circuit layer 12' of the first build-up layer 10 and the second circuit layer 22 are electrically connected to each other via these first conductive vias 13.

Then, a second dielectric layer 21 is formed to cover the second pads 220 and the second circuits 221 of the second circuit layer 22 and the first dielectric layer 11'. The second dielectric layer 21 may have the same or similar material or configuration to that of the aforementioned first dielectric layer.

Then, a plurality of through hole (now shown) are formed on the second dielectric layer 21 to expose the second pads 220 of the second circuit layer 22 by processes the same or similar to the formation of aforementioned through holes 110, and then a second circuit layer 22' can be formed on a side (or, surface) of the second dielectric layer 21 located away from the carrier C and a plurality of second conductive vias 23 can be formed at the through holes in the second dielectric layer 21. It is noted that the second circuit layer 22' may have the same or similar material and configuration to that of the second circuit layer 22. As shown, the second circuit layer 22' may include a plurality of second pads 220' and a plurality of second circuits 221'. It is noted that the quantity and arrangement of the second pads 220' and the second circuits 221' of the second circuit layer 22' may be determined according to actual requirements and are not intended to limit the disclosure. In this embodiment, the second circuit layer 22, the second dielectric layer 21, and the second circuit layer 22' are alternately stacked on the side (or, surface) of the first build-up layer 10 located away from the carrier C, and the second conductive vias 23 are located within the second dielectric layer 21 and the second conductive vias 23 are interposed between the second circuit layer 22 and the second circuit layer 22'; in specific, second conductive vias 23 are structurally connected between the second pads 220 of the second circuit layer 22 and the second pads 220' of the second circuit layer 22' so that the second circuit layer 22 and the second circuit layer 22' are electrically connected to each other via these second conductive vias 23. Also, similar to the first conductive vias 13 of the first build-up layer 10, the second conductive via 23 also have a tapered profile; in specific, an outer diameter of the second conductive via 23 gradually decreases in a direction towards the carrier C, in other words, the outer diameter of the second conductive via 23 gradually increases in a direction away from the carrier C, in short, the second conductive via 23 is tapered towards the carrier C.

Accordingly, the second circuit layer 22, the second dielectric layer 21, and the second circuit layer 22' are alternately stacked to form a second build-up layer 20 on the side (or, surface) of the first build-up layer 10 located away from the carrier C. In this embodiment, the second build-up layer is formed by alternately stacking conductive and non-conductive layers on the carrier, each second circuit layer and second dielectric layer may be considered as a sub-layer of the second build-up layer, but it is noted that the number of the sub-layers of a second build-up layer may be determined according to actual requirements and are not intended to limit the disclosure. In some other embodiments, one second build-up layer may only include one second dielectric layer and one second circuit layer which are arranged in alternate manner. In another embodiment, one second build-up layer may include more required number of second dielectric layers and second circuit layers which are arranged in alternate manner.

In this embodiment, the formation of the first build-up layer 10 is implemented under an environment which is able to make its first circuits 121 and 121' have an ultra-fine and accurate line width/line spacing (also known called "line/spacing (L/S)"), thus the first build-up layer 10 can be served as a redistribution layer (RDL), and the line width and line spacing of the second circuits 221 and 221' of the second build-up layer 20 stacked on the first build-up layer 10 may not be as fine as that of first build-up layer 10. In short, line width/line spacing of the first build-up layer 10 are smaller than the line width/line spacing of the second build-up layer 20.

Specifically, in this embodiment, the line width/line spacing of the first circuits 121 and 121' of the first build-up layer 10 are smaller than the line width/line spacing of the second circuits 221 and 221' of the second build-up layer 20; in other words, the first circuits 121 and 121' of the first build-up layer 10 are finer than the second circuits 221 and 221' of the second build-up layer 20. For example, the first circuits 121 and 121' of the first build-up layer 10 may be formed to have a line width/line spacing of about 10 μm or less and therefore makes the first build-up layer 10 suitable for being employed as a fine pitch redistribution layer. For example, the second circuits 221 and 221' of the second build-up layer 20 may be formed to have a line width/line spacing ranging larger than 10 μm (e.g., 10 μm to 35 μm or larger). As discussed above, the first build-up layer 10 are formed on surfaces having high flatness and smoothness therefore is favorable for realizing high accuracy and yield rate in fine pitch required by the first circuits 121 and 121'.

In specific, as discussed in the aforementioned steps, the first build-up layer 10 is formed on the carrier C and then the second build-up layer 20 is formed on the first build-up layer 10, thus ensures that the formation of the first build-up layer 10 is implemented on a surface having a relatively high flatness and smoothness since the carrier C is generally a layer structure minimally processed. Due to the high flatness and smoothness of the carrier C, focus errors during exposure operation are prevented. In more specific, the surface condition of the carrier C makes it possible to use a fixed focal depth for the exposure of the whole surface and therefore is favorable for obtaining a pattern meet the requirements in the density, accuracy, and uniformity of fine line, such that the first circuits 121 and 121' are possible to obtain high accuracy and yield rate in the uniformity of the pattern, line width, and line spacing required by fine pitch. The improvement of the accuracy and uniformity of the line width/line spacing of the first circuits 121 and 121' is beneficial to improve the uniform impedance of the first circuits 121 and 121'. The above advantages make the first build-up layer 10 suitable to be employed as a redistribution layer with required accuracy, yield rate, and uniformity of fine line width/spacing.

Regarding the second build-up layer 20, the flatness and smoothness of the first build-up layer 10 are sufficient for the second circuits 221 and 221' to achieve the required accuracy and yield rate.

In addition, since the first build-up layer 10 and the second build-up layer 20 are sequentially formed on the carrier C, the first build-up layer 10 is located between or sandwiched between the second build-up layer 20 and the carrier C. Thus, before the removal of the carrier C, the first circuit layer 12 and 12' of the first build-up layer 10 are prevented from exposing to ambient air or being damaged due to unexpected impact or hitting. Also, in this embodiment, the second build-up layer 20 is directly formed on the first build-up layer 10 using the techniques the same as that used to form the first build-up layer 10, which is beneficial to simplify the manufacturing processes and reduce the cost.

Optionally, one or more alignment target holes PH may be formed on a side of the carrier C located away from the first build-up layer 10 and the second build-up layer 20. The alignment target holes PH may be formed by using laser to penetrate through the release film R and the metallic film 62 which are located on the side of the carrier C located away from the first build-up layer 10 and the second build-up layer 20. In the later steps, the alignment target holes PH are provided to assist in aligning the second build-up layer and a core layer 30 with each other. It is noted that the alignment target holes PH are optional and it is also noted that the quantity, size, formation, and location of the alignment target holes PH may be determined according to actual requirements and are not intended to limit the disclosure.

Then, please refer to FIG. 9, a core layer 30 is provided. The configuration, type and material of the core layer 30 are determined according to actual requirements and are not intended to limit the disclosure. For example, in this embodiment, the core layer may be a wiring substrate (e.g., a circuit board), the core layer 30 may include a dielectric layer 31, a plurality of vias 32, and a plurality of wiring layers 33a-33d. The dielectric layer 31 may be made of any suitable resin but the disclosure is not limited thereto. In other embodiments, the dielectric layer 31 may be made of other suitable dielectric material. The wiring layers 33a-33d may be made of any conductive material but the disclosure is not limited thereto. The wiring layers 33a-33d may each have a line width/line spacing of about 35 μm or larger.

As shown, the wiring layer 33a may be formed on a side (or, surface) of the dielectric layer 31, the wiring layer 33b and the wiring layer 33c may be formed inside the dielectric layer 31, and the wiring layer 33d may be formed on another a side (or, surface) of the dielectric layer 31. It is noted that the wiring layer 33b and the wiring layer 33c depicted in the dielectric layer 31 are exemplary but not intended to limit the disclosure. In some other embodiments, there may be only one wiring layer or more than two wiring layers inside the dielectric layer of the core layer.

The vias 32 may be made of any suitable conductive material. In this embodiment, the via 32 is, for example, a plating through hole (PTH). The vias 32 penetrate through the dielectric layer 31 and are electrically connected to the wiring layers 33a-33d so that the wiring layers 33a-33d are able to be electrically connected to one another via the vias 32. In addition, in this embodiment, the wiring layer 33a and the wiring layer 33d may each have one or more conductive contacts 331 exposed from the outer surface of the dielectric layer 31, the conductive contacts 331 are provided for the formation of the structure (e.g., a bonding layer 40 shown in FIG. 15) used to be bonded to the second build-up layer 20.

Then, please refer to FIG. 10, a solder mask layer SM is selectively disposed on a side (or, surface) of the core layer 30. For example, in this embodiment, the solder mask layer SM may partially cover the side (or, surface) of the core layer 30 in which the wiring layer 33d is disposed, and the solder mask layer SM may have one or more openings O selectively exposing one or more of the conductive contacts 331 of the wiring layer 33d. In this embodiment, the solder mask layer SM may be made of green pigment, photosensitive dielectric material, ABF film, or macromolecule resin, but the disclosure is not limited thereto.

Figure 11:
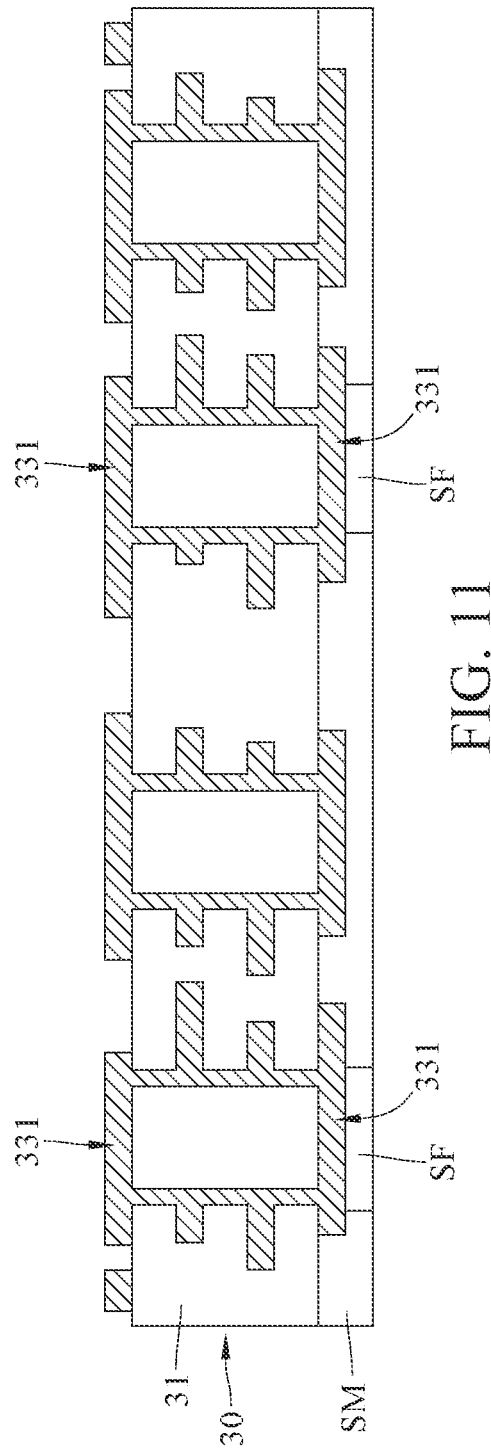

Then, please refer to FIG. 11, a surface finish layer SF is selectively formed in the openings O of the solder mask layer SM to cover the conductive contacts 331 exposed by the solder mask layer SM so as to protect the conductive contact 331. The surface finish layer SF may be made of any suitable metallic material or any suitable antioxidant organic film, such as gold, silver, palladium, nickel, tin or organic solderability preservative (OSP), but the disclosure is not limited thereto.

Figure 12:
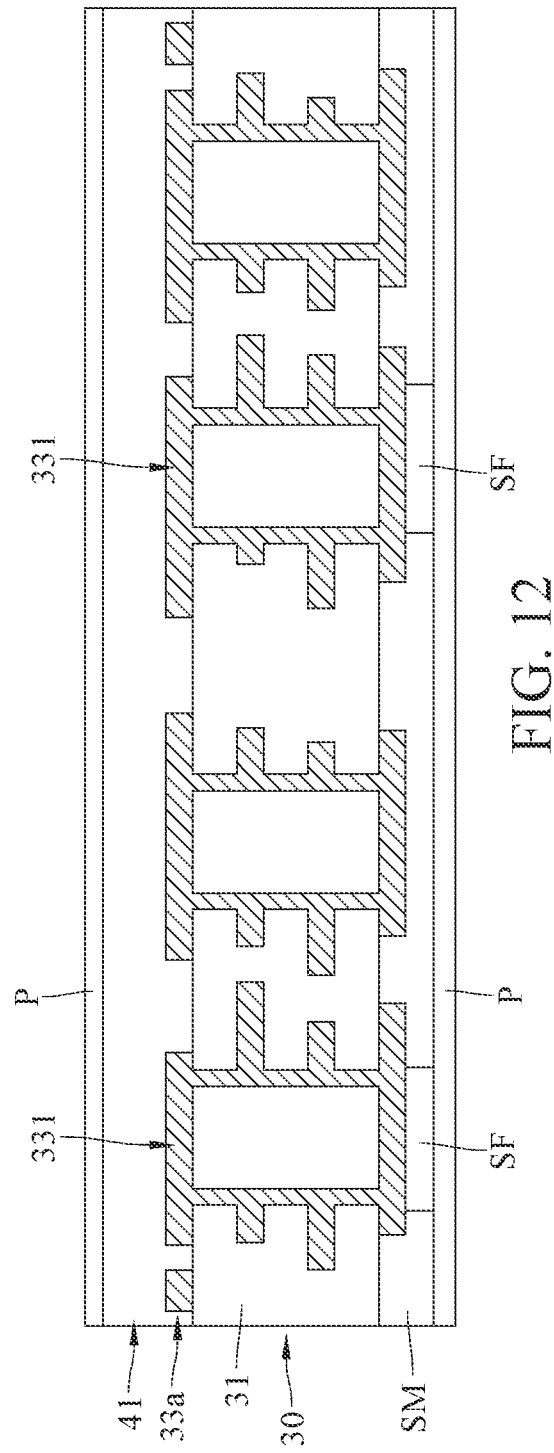

Then, please refer to FIG. 12, a dielectric build-up layer 41 may be formed to cover a side (or, surface) of the core layer 30 in which the stack of the first build-up layer and the second build-up layer 20 will be disposed and the conductive contacts 331 thereon. The dielectric build-up layer 41 is, for example, a prepreg or made of any other suitable material.

Optionally, a protective layer P may be formed on a side (or, surface) of the dielectric build-up layer 41 located away from the core layer 30. The protective layer P may be made of polyethylene terphthalates (PET) or other suitable material, but the disclosure is not limited thereto.

Optionally, another protective layer P may be disposed on a side (or, surface) of the surface finish layer SF and solder mask layer SM located away from the core layer 30.

Figure 13:
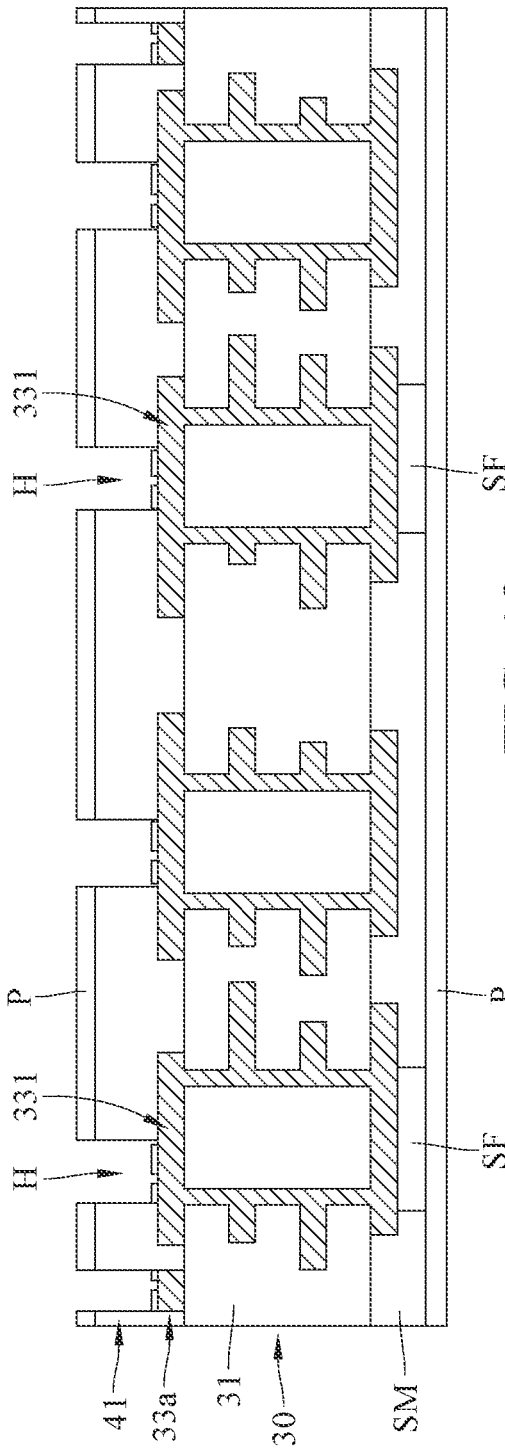

Then, please refer to FIG. 13, one or more holes H which penetrate through the protective layer P and the dielectric build-up layer 41 are formed to expose at least one of the conductive contacts 331 on the core layer 30. The holes H may be formed by, but not limited to, means of laser beam machining, mechanical drilling, or any suitable etching process. It is noted that the formation, location, and quantity of the holes H may be determined according to actual requirements and are not intended to limit the disclosure.

Figure 14:
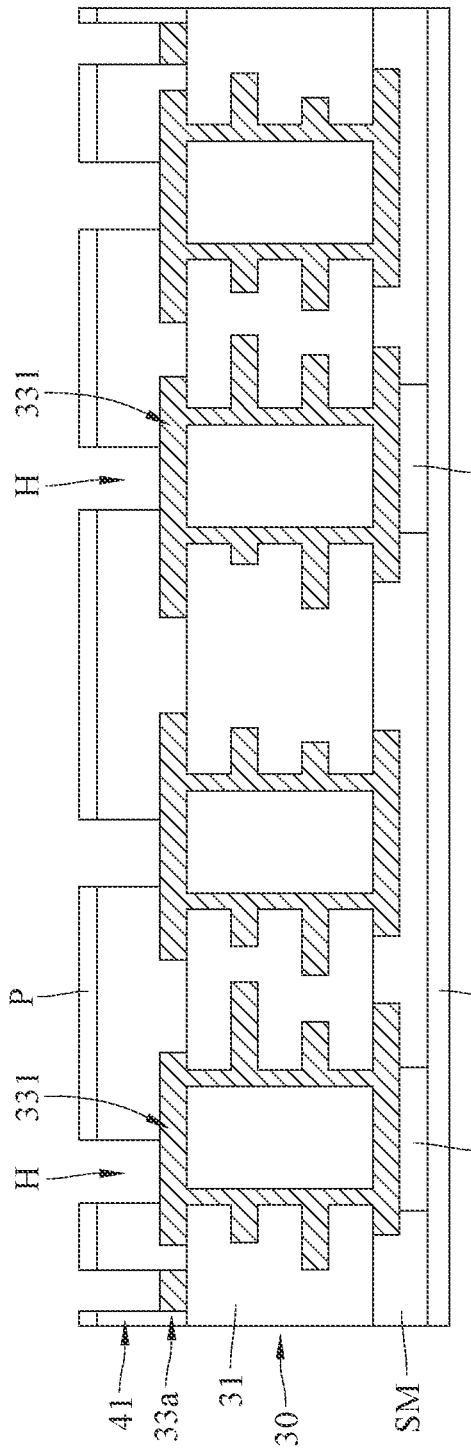

Then, optionally, please refer to FIG. 14, a step of cleaning the holes H using, for example, ultraviolet light (UV) is performed.

Figure 15:
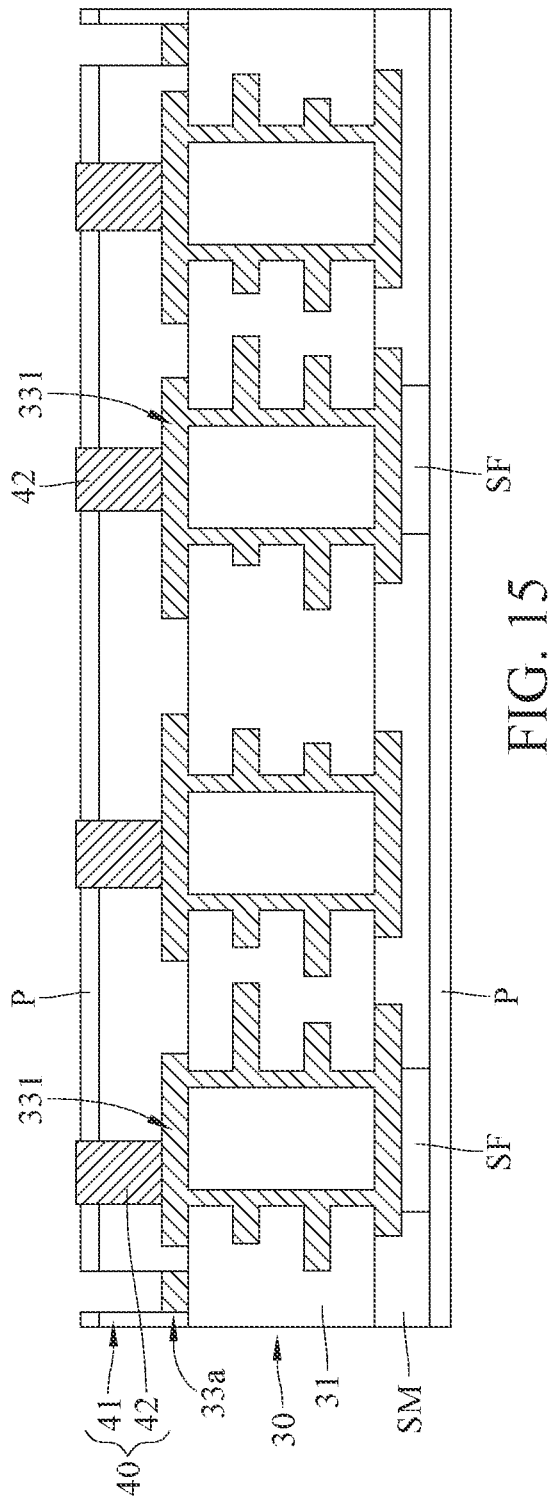

Then, please refer to FIG. 15, conductive pastes 42 are filled into the holes H. The conductive pastes 42 may be made of any suitable conductive material. In some embodiments, the conductive pastes 42 may be made of copper. In the step of filling the conductive pastes 42 into the holes H, the conductive pastes 42 may stick out of the holes H. Specifically, the conductive pastes 42 may at least be flushing with or slightly sticking out the side (or, surface) of the protective layer P located away from the dielectric build-up layer 41.

Figure 16:
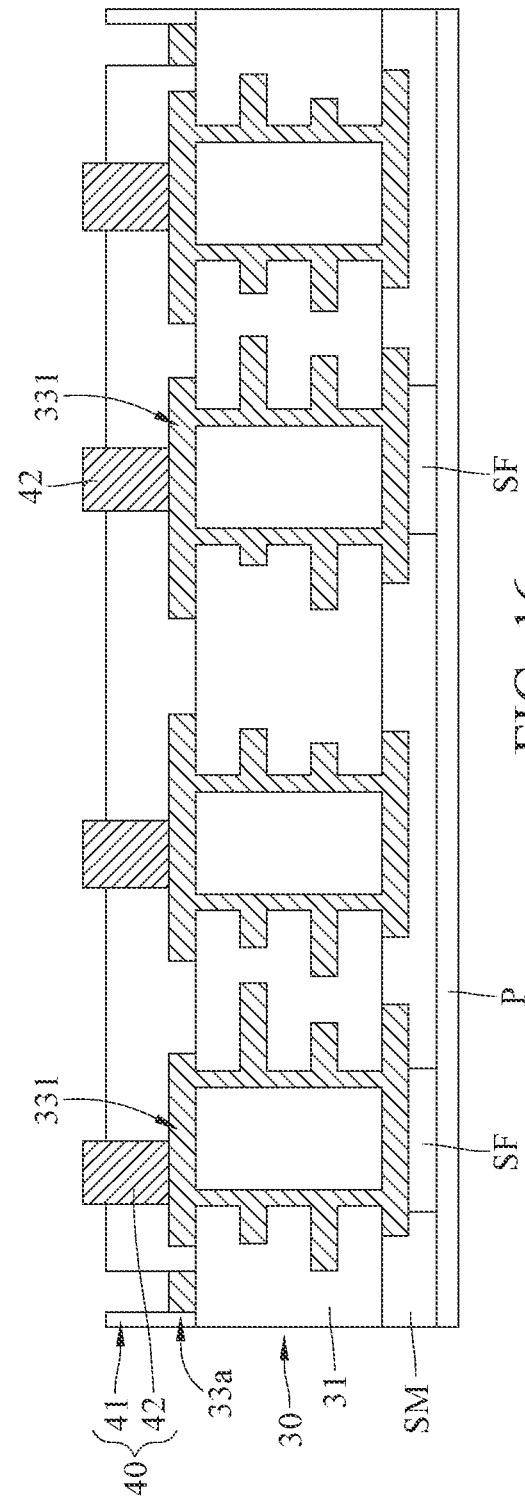

Then, please refer to FIG. 16, the protective layer P is removed from the dielectric build-up layer 41 to reveal the surface of the dielectric build-up layer 41. As shown, before the removal of the protective layer P from the dielectric build-up layer 41, the conductive pastes 42 are flushing with or slightly sticking out the side (or, surface) of the protective layer P located away from the dielectric build-up layer 41, thus when the protective layer P is removed, the conductive pastes 42 are ensured to be sticking out of the dielectric build-up layer 41. This ensures that the conductive pastes 42 each have a part exposed from the dielectric build-up layer 41 and sufficient for the conductive pastes 42 to have a firm bonding to other structures. (e.g., the second pads 220' shown in FIG. 17). As shown, the dielectric build-up layer 41 and the conductive paste 42 may together form a bonding layer 40 on the core layer 30, where the bonding layer 40 is used for attaching the side (or, surface) of the second build-up layer 20 located away from the first build-up layer 10 to the core layer 30.

Figure 17:
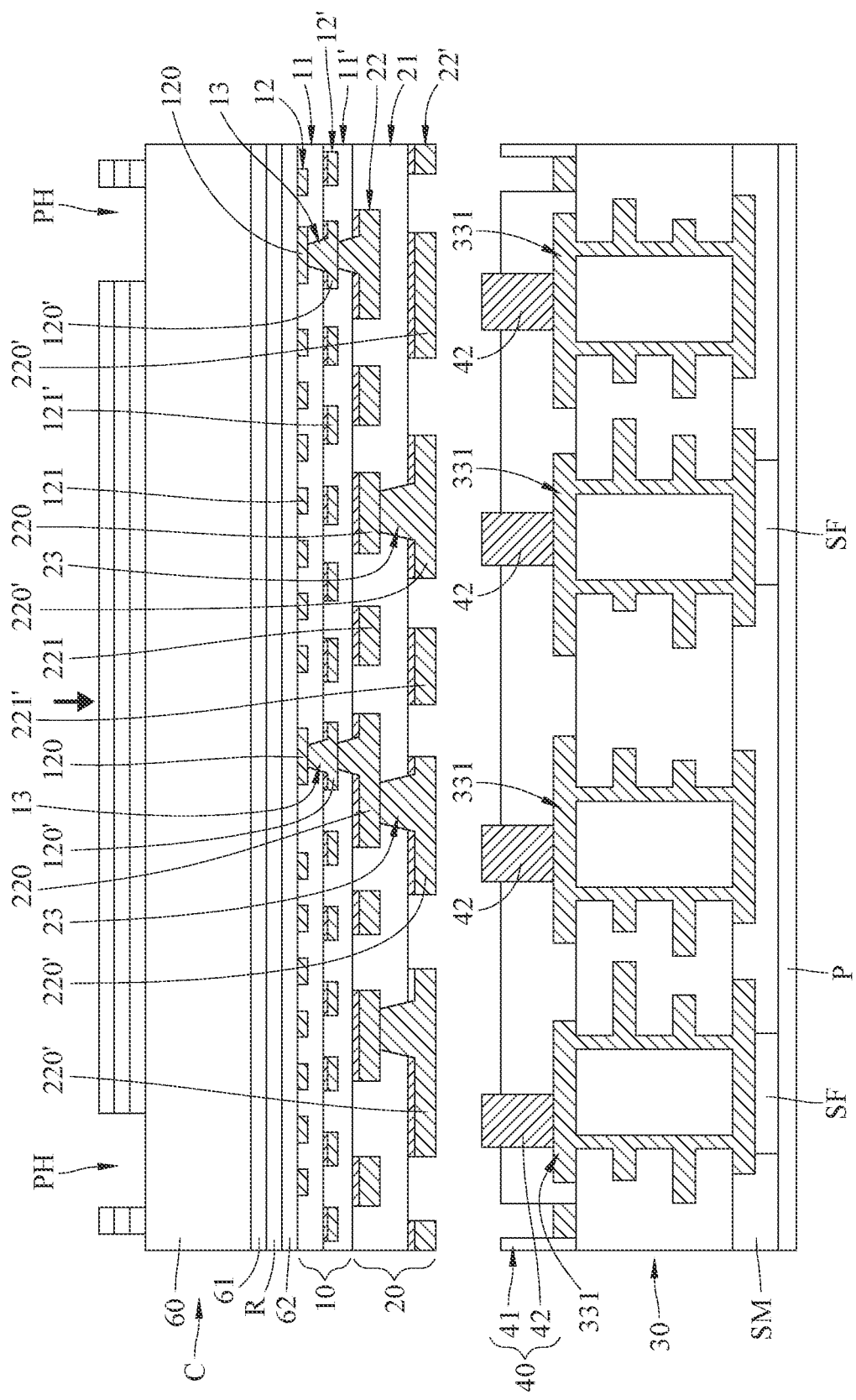
Figure 18:
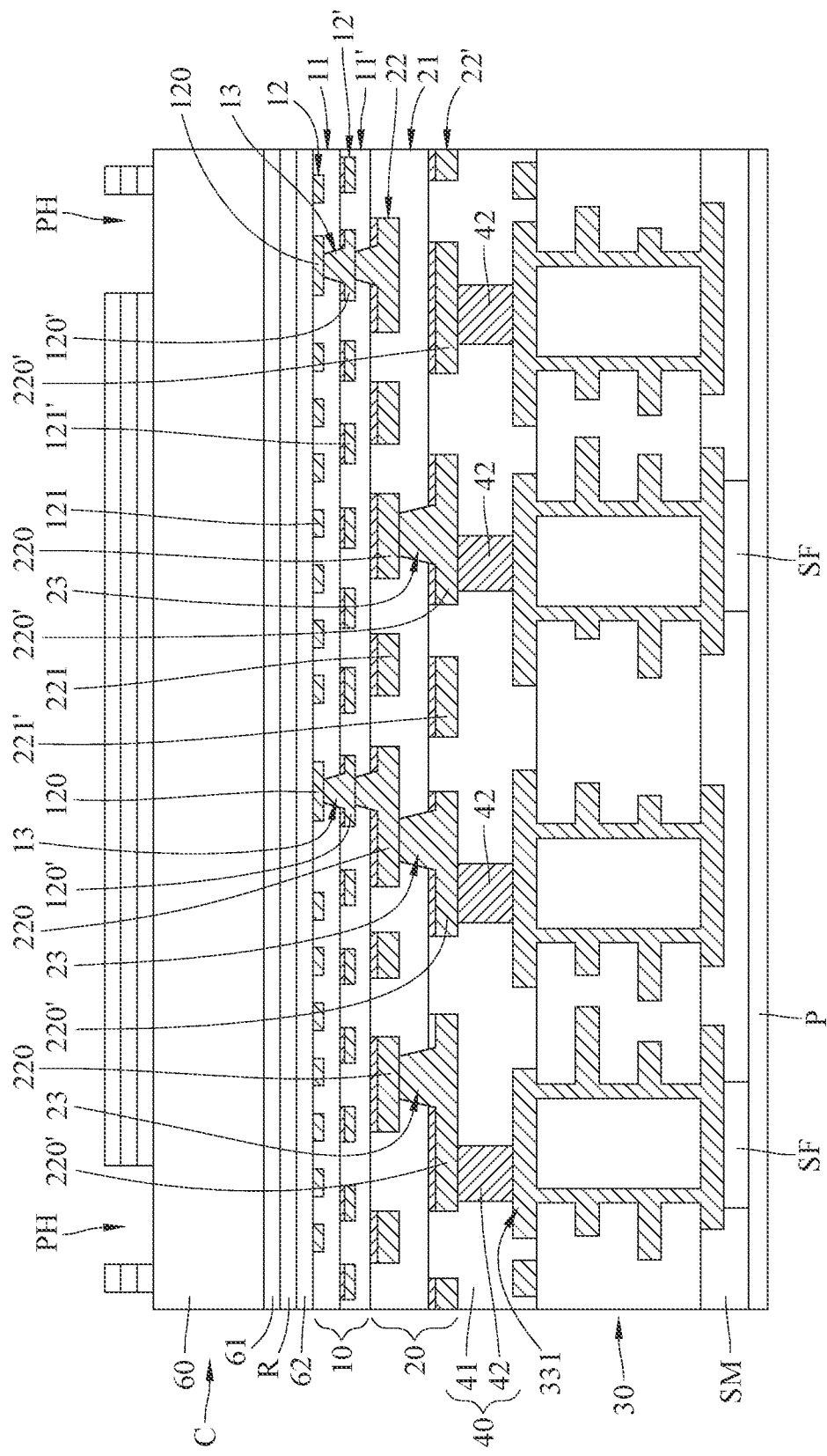

Please refer to FIGS. 17-18, the structure shown in FIG. 8 will be structurally connected to the structure shown in FIG. 16. Specifically, as the direction indicated by the arrow, the second pads 220' of the second circuit layer 22' of the second build-up layer 20 are respectively coupled to the conductive pastes 42 of the bonding layer 40, such that the second build-up layer 20 is attached to the core layer 30.

During this process, the alignment target holes PH which located at the side (or, surface) of the carrier C located away from the first build-up layer 10 and the second build-up layer 20 can be read as alignment points by a charge coupled device (CCD), thus the second pads 220' of the second build-up layer 20 are ensured to be accurately coupled to the conductive pastes 42 of the bonding layer 40. In some embodiments, during the attachment of the second pads 220' of the second build-up layer 20 to the conductive pastes 42 of the bonding layer 40, the conductive pastes 42 may be subjected to a transient-liquid-phase sintering (TLPS) process so as to be structurally fixed to and electrically connected to the second pads 220'. As such, the second pads 220' of the second build-up layer 20 are able to be electrically connected to the conductive contacts 331 of the core layer 30 via the conductive pastes 42 of the bonding layer 40.

Figure 19:
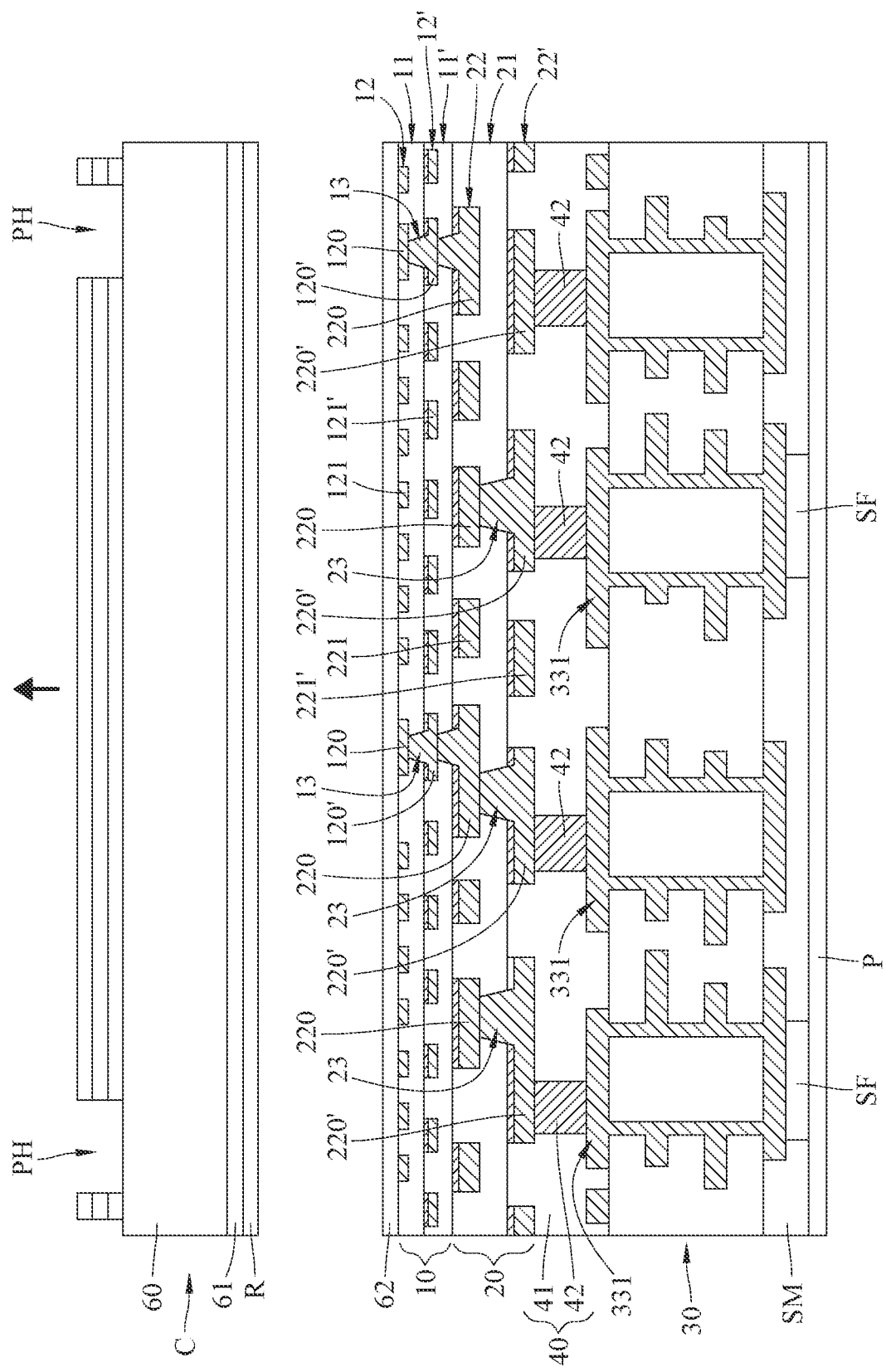

Then, please refer to FIG. 19, as the direction indicated by the arrow, the carrier C and the release film R on the carrier C are removed from the first build-up layer 10. Specifically, the release film R is separated from the metallic film 62 so that the carrier C and the release film R thereon are removed from the first build-up layer 10, and the metallic film 62 remains on the first build-up layer 10. In this embodiment, the removal of the release film R may be achieved using any suitable method, such as providing specific light, heating, applying mechanical force (e.g., peeling) or reducing the adhesiveness of the release film R by laser, but the disclosure is not limited thereto.

Figure 20:
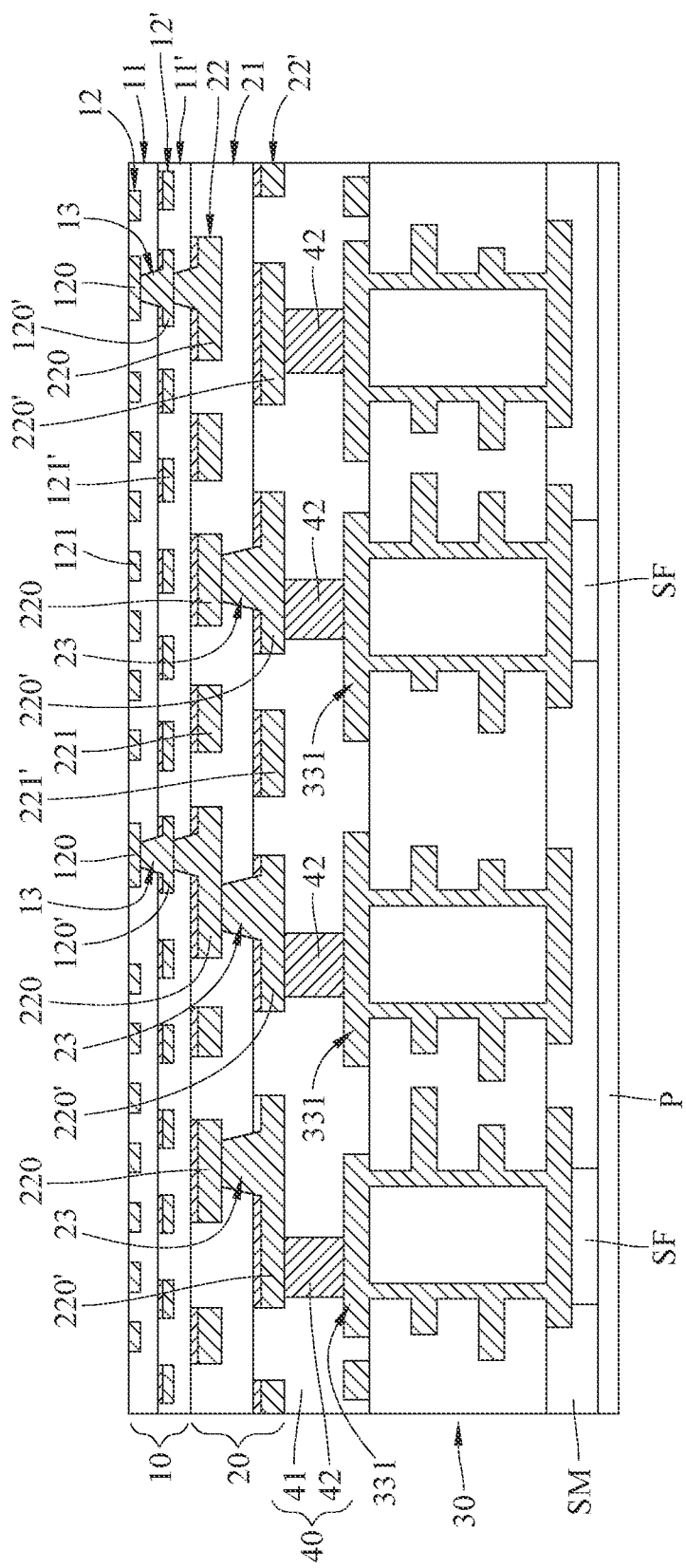

Then, optionally, please refer to FIG. 20, the metallic film 62 covering the first build-up layer 10 is removed to reveal the first circuit layer 12 and the first dielectric layer 11 of the first build-up layer 10.

Figure 21:
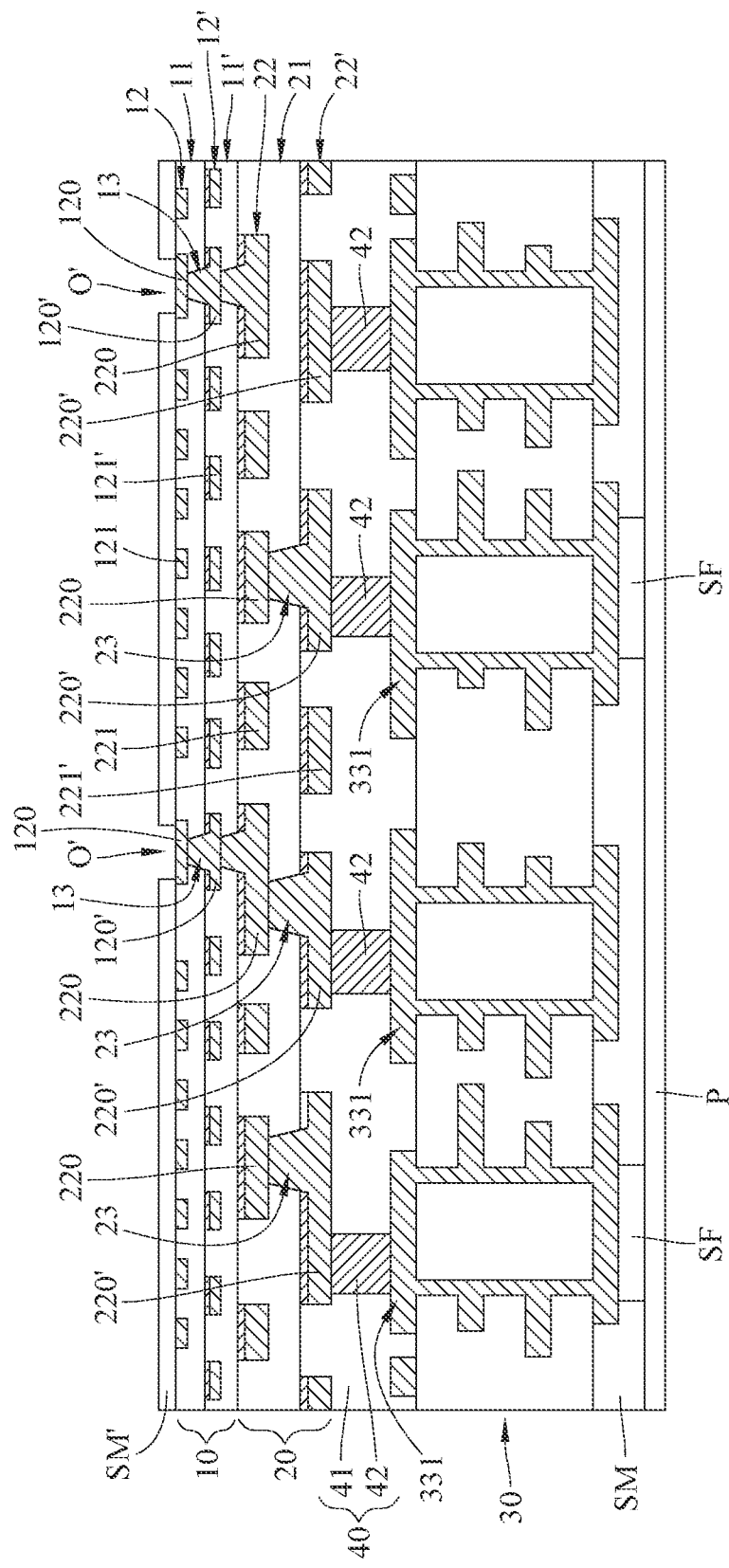

Then, optionally, please refer to FIG. 21, a solder mask layer SM' is selectively disposed on a side (or, surface) of the first build-up layer 10 located away from the second build-up layer 20. The solder mask layer SM' may partially cover the side (or, surface) of the first build-up layer 10 located away from the second build-up layer 20 and the solder mask layer SM' may have one or more openings O' selectively exposing one or more of the first pads 120 located away from the second build-up layer 20. In this embodiment, the solder mask layer SM' may be made of green pigment, photosensitive dielectric material, ABF film, or macromolecule resin, but the disclosure is not limited thereto.

Figure 22:
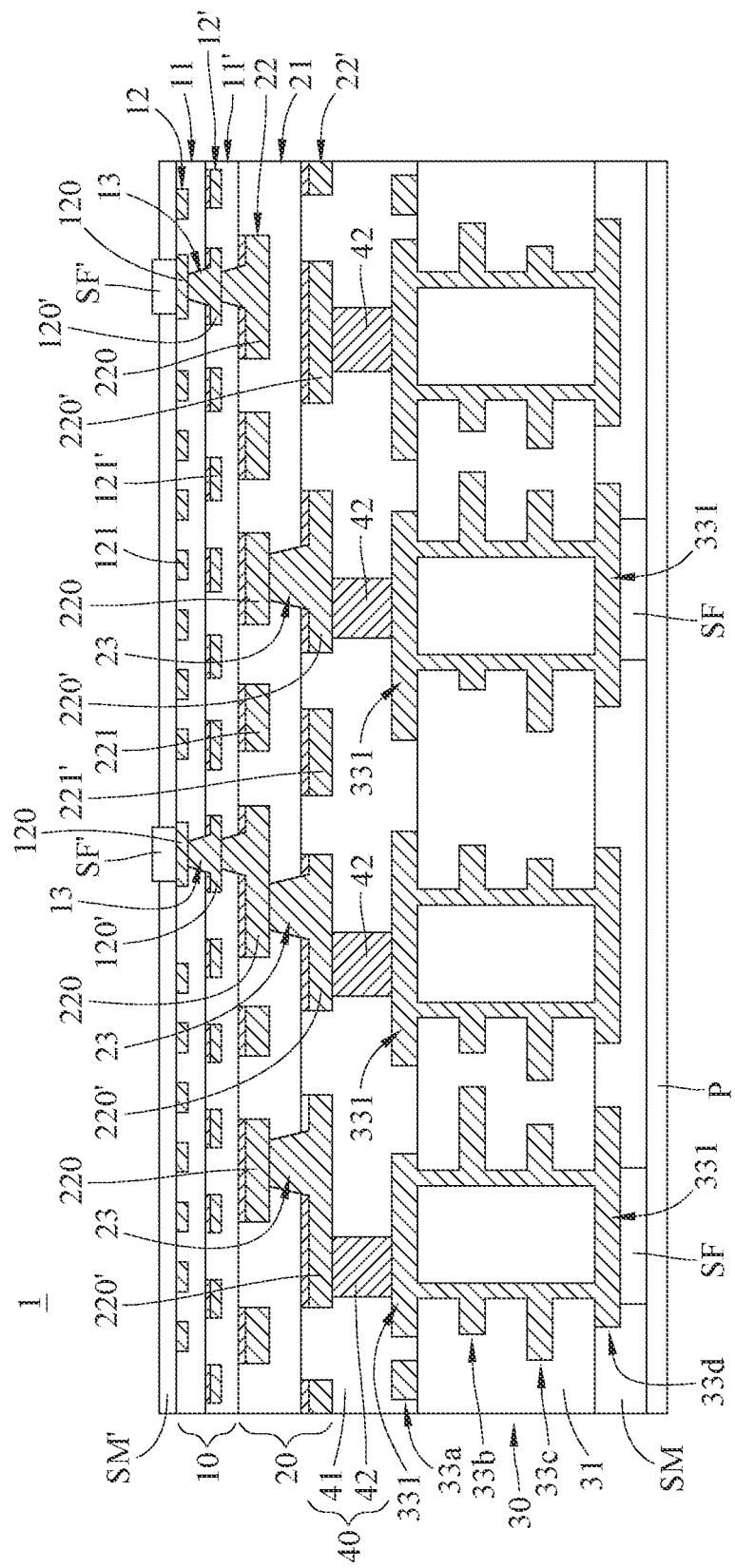

Then, optionally, please refer to FIG. 22, a surface finish layer SF' is selectively formed in the openings O' of the solder mask layer SM' to cover the first pads 120 exposed by the solder mask layer SM' so as to protect the first pads 120. The surface finish layer SF' may be made of any suitable metallic material or any suitable antioxidant organic film, such as gold, silver, palladium, nickel, tin or organic solderability preservative (OSP), but the disclosure is not limited thereto.

By following the aforementioned steps, a circuit board structure 1 which includes a stack of the core layer 30, the second build-up layer 20, and the first build-up layer 10 are completed.

According to the aforementioned steps, the first build-up layer 10 and the second build-up layer 20 are formed on the carrier C using the same or similar process and then to be attached to the bonding layer 40 on the core layer 30 via the second build-up layer 20, thus, in the circuit board structure 1, the outer diameter of each first conductive via 13 and the outer diameter of each second conductive via 23 both gradually decrease in a direction away from the core layer 30; in other words, the outer diameter of each first conductive via 13 and the outer diameter of each second conductive via 23 both gradually increases in a direction towards the core layer 30. In short, in the circuit board structure 1, the first conductive vias 13 in the first build-up layer 10 and the second conductive vias 23 in the second build-up layer 20 each have a shape tapering towards a direction away from the core layer 30.

Also, in such a manufacturing method, the formation of the first build-up layer 10 is implemented on a surface having a relatively high flatness and smoothness (i.e., the carrier C), thus the focus errors during exposure operation are prevented to favorable for achieving an ultra-fine line width and spacing and improving accuracy and uniformity of the first circuits 121 and 121'. This makes the first build-up layer 10 capable of meeting the requirements of an ultra-fine line redistribution layer.

In addition, the first build-up layer 10 and the second build-up layer 20 can be formed using the same techniques, which is beneficial to simplify the manufacturing processes and reduce the cost and also avoids using tin balls for connecting build-up layers with different line widths and therefore prevents low conductivity, increase of high frequency noise, and low integrity of high frequency signal due to the usage of tin balls.

Further, the second build-up layer 20 is attached to the core layer 30 via the conductive pastes 42 of the bonding layer 40, in the case that the conductive pastes 42 are copper pastes, the conductive pastes 42 are able to ensure the conductivity required by the communication between the second build-up layer 20 and the core layer 30 and also able to reduce the noise during the high frequency signal transmission and thereby improving the integrity of high frequency signal.

Moreover, before the removal of the carrier C, the first build-up layer 10 is located between the second build-up layer 20 and the carrier C and therefore the first circuit layer 12 and 12' of the first build-up layer 10 are prevented from exposing to ambient air or being damaged due to unexpected impact or hitting.

Lastly, it is noted that the order of the steps in FIGS. 1-8 and the steps in FIGS. 9-16 may be changed as required.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A manufacturing method for circuit board structure, comprising:
    providing a carrier;
    forming a first build-up layer on the carrier, wherein the first build-up layer comprises a plurality of first circuits;
    forming a second build-up layer on a side of the first build-up layer located away from the carrier, wherein the second build-up layer comprises a plurality of second circuits, and the plurality of first circuits are finer than the plurality of second circuits;
    attaching a side of the second build-up layer located away from the first build-up layer to a core layer;
    removing the carrier from the first build-up layer and wherein the at least one first conductive via and the at least one second conductive via are tapered towards a direction away from the core layer.

2. The manufacturing method according to claim 1, wherein the step of forming the first build-up layer on the carrier comprises:
    alternately stacking a plurality of first dielectric layers and a plurality of first circuit layers formed by the plurality of first circuits on the carrier; and
    forming at least one first conductive via which penetrates through the plurality of first dielectric layers and is interposed between the plurality of first circuit layers.

3. The manufacturing method according to claim 2, wherein the step of forming the second build-up layer on the side of the first build-up layer located away from the carrier comprises:
    alternately stacking a plurality of second dielectric layers and a plurality of second circuit layers formed by the plurality of second circuits on the side of the first build-up layer located away from the carrier, wherein the at least one first conductive via is structurally connected to one of the plurality of second circuit layers; and
    forming at least one second conductive via which penetrates through the plurality of second dielectric layers and is interposed between the plurality of second circuit layers.

4. The manufacturing method according to claim 3, wherein the step of attaching the side of the second build-up layer located away from the first build-up layer to the core layer comprises:
    forming a bonding layer on the core layer; and
    attaching the second build-up layer to the bonding layer.

5. The manufacturing method according to claim 4, wherein the step of forming the bonding layer on the core layer comprises:
    forming a dielectric build-up layer on the core layer;
    forming at least one hole which penetrates through the dielectric build-up layer and exposes at least one conductive contact of the core layer; and
    applying at least one conductive paste into the at least one hole, wherein the at least one conductive paste sticks out of the at least one hole and is structurally connected to one of the plurality of second circuit layers of the second build-up layer.

6. The manufacturing method according to claim 5, wherein the step of attaching the second build-up layer to the bonding layer comprises:
    sintering the at least one conductive paste to secure the second build-up layer to the core layer.

7. The manufacturing method according to claim 5, after the step of forming the dielectric build-up layer on the core layer, further comprising:
    disposing a protective layer on a side of the dielectric build-up layer located away from the core layer;
    forming the at least one hole which penetrates through the dielectric build-up layer and the protective layer; and
    applying the at least one conductive paste into the at least one hole to make the at least one conductive paste stick out of a surface of the protective layer located away from the dielectric build-up layer.

8. The manufacturing method according to claim 1, further comprising:
    forming at least one alignment target hole on a side of the carrier located away from the first build-up layer for the second build-up layer to align with the core layer.

9. The manufacturing method according to claim 1, further comprising:
    disposing a release film on the carrier; and
    removing the carrier and the release film on the carrier from the first build-up layer.

10. A circuit board structure, comprising:
    a first build-up layer comprising a plurality of first circuits and at least one first conductive via structurally connected to at least part of the plurality of first circuits;
    a second build-up layer disposed on the first build-up layer and comprising a plurality of second circuits and at least one second conductive via structurally connected to at least part of the plurality of second circuits, wherein the plurality of first circuits are finer than the plurality of second circuits; and
    a core layer disposed on a side of the second build-up layer located away from the first build-up layer;
    wherein the at least one first conductive via and the at least one second conductive via are tapered towards a direction away from the core layer.

11. The circuit board structure according to claim 10, further comprising a dielectric build-up layer and at least one conductive paste, wherein the dielectric build-up layer is located between the core layer and the second build-up layer, the at least one conductive paste penetrates through the dielectric build-up layer and is structurally connected between part of the plurality of second circuits and at least one conductive contact of the core layer.

* * * * *